United States Patent
Bennett

(10) Patent No.: US 7,315,991 B1
(45) Date of Patent: Jan. 1, 2008

(54) COMPILING HLL INTO MASSIVELY PIPELINED SYSTEMS

(75) Inventor: David W. Bennett, Lafayette, CO (US)

(73) Assignee: Xilinx, Inc., San Jose, CA (US)

(*) Notice: Subject to any disclaimer, the term of this patent is extended or adjusted under 35 U.S.C. 154(b) by 330 days.

(21) Appl. No.: 11/064,401

(22) Filed: Feb. 23, 2005

(51) Int. Cl.
*G06F 17/50* (2006.01)

(52) U.S. Cl. .................. 716/1; 716/3; 716/16; 716/18
(58) Field of Classification Search ............... 716/1, 716/3–5, 16–18; 712/1; 703/13–15; 717/146; 714/725
See application file for complete search history.

(56) References Cited

U.S. PATENT DOCUMENTS

| | | | | |
|---|---|---|---|---|
| 5,603,043 A | * | 2/1997 | Taylor et al. .................. 712/1 |
| 7,072,818 B1 | * | 7/2006 | Beardslee et al. ............ 703/14 |
| 7,076,416 B2 | * | 7/2006 | Chen et al. ................... 703/15 |
| 7,080,365 B2 | * | 7/2006 | Broughton et al. ......... 717/146 |
| 2002/0188910 A1 | * | 12/2002 | Zizzo ............................ 716/1 |
| 2003/0121010 A1 | * | 6/2003 | Aubury ........................ 716/4 |

* cited by examiner

Primary Examiner—Paul Dinh
(74) Attorney, Agent, or Firm—Kevin T. Cuenot

(57) ABSTRACT

A method of creating a circuit from a high level programming language (HLL) program can include generating a netlist from the HLL program, wherein the netlist specifies the circuit design (1320, 1325). The circuit design can be run within a programmable logic device and a plurality of execution threads can be identified at runtime to determine scheduling information (1335, 1340).

15 Claims, 8 Drawing Sheets

```
int result;
if (a==b)
        result=dosomething();
else
        result=somethingelse();
```

```
reg     tmp,res
add     a,-b;tmp
demux   m1;tmp;b0;b1;a,b,res
unreg   tmp branch   b0;a,b,res
call     dosomething;a,b;res
unbranch b0;a,b,res branch   b1;a,b,res
call     somethingelse;a,b;res
unbranch b1;a,b,res mux     m1;a,b,res
```

```
int i;
for (i = 0; i < n; i++)
        res=dosomething(val,i);
```

```
reg     i,val,res
add     0;i       // initialize begin   l1;val,n,res;i
reg     borrow
add     i,-n;;borrow loop    l1;borrow;val,n,res;i
unreg   borrow
call    dosomething;i,val;res iterator l1,i
add     i,1;i
iterate l1,i end     l1;val,i;res
```

FIG. 8

```
int res=c;
int i;
for (i = 0; i < n;i++)
    res=dosomething(res);
```

FIG. 9

```
reg      i,res
add      c;res
add      0;i
begin    l1;n,res;i
reg      borrow
add      i,-n;;borrow
loop     l1;n,res;i
unreg    borrow
// setup code for dosomething?
wait     l1;res
call     dosomething;res;res
sync     l1;res
iterator l1;i
add      i,1;i
iterate  l1;i
end      l1;i,res
```

FIG. 11

```
void fir_gen(short* x, short* h, short* r, int nh, int nr)
{
    int i, j, sum;
    for (j=0; j<nr; j++)
    {
        sum = 0;
        for (i=0; i<nh; i++)
            sum +=x[i+j]*h[i];
        r[j]=sum>>15;
    }
}
```

FIG. 12

```
enter      fir_gen;x,h,r,nh,nr
   reg         j,sum
   add         0;j
   begin       f1;sum,x,h,r,nh,nr;j
      reg        tmp
      add        j,-nr;;tmp
      loop       f1;tmp;sum,x,h,nh,nr;j
   unreg       tmp reg         i
   add         0;sum,i
   begin       f2;j,sum,x,h,nh;i
   reg    tmp
      add    i,-nh;;tmp
      loop   f2;j,sum,x,h,nh;i add      i<<1,j<<1,x;tmp
      readaddr     tmp,2,1
   reg      tmp1
      add    i<<1,h;tmp1
   read     tmp
   readaddr       tmp1,2,1
   read     tmp1
      multiply     tmp,tmp1;tmp
      wait w2,sum
      add  sum,tmp;sum
      sync w2,sum iterator f2,i
      add   i,1;i
      iterate       f2,i
end         f2;sum,I
reg         tmp
add         j<<1,r;tmp
writeaddr tmp,2,1
unreg       tmp
write       sum>>15 iterator    f1,j
   add          j,1;j
   iterate      f1,j
end         f1,j
```

COMPILING HLL INTO MASSIVELY PIPELINED SYSTEMS

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

1. Field of the Invention

This invention relates to the field of electronic circuit design and, more particularly, to designing circuits using high level programming languages.

2. Description of the Related Art

Traditionally, designs for electronic circuits have been specified using a hardware description language (HDL) such as Verilog or VHDL. HDLs allow circuit designers to design and document electronic systems at various levels of abstraction. Designs for programmable logic devices (PLDs), such as field programmable gate arrays (FPGAs) and application specific integrated circuits (ASICs), can be modeled using an HDL. The design then can be simulated and tested using appropriate software-based design and/or synthesis tools.

One recent trend in circuit design has been to use high level programming languages (HLLs) to design electronic circuits. For example, a circuit design can be specified initially as a program written in an HLL such as Fortran, C/C++, JAVA, or the like. This approach allows a developer to concentrate on an algorithmic solution to a problem rather than the specific hardware involved. A variety of different tools are available which effectively translate the HLL program into a synthesizable netlist or other software-based circuit representation.

Typically, the process of generating a circuit design from an HLL program involves inferring gates directly from the HLL program. More particularly, a compiler builds an internal representation of the HLL program in the form of a control data-flow graph. From that graph, register transfer level (RTL) descriptions and netlists can be generated. The results further can be processed using conventional HDL development tools.

Despite the advantages of HLL-based circuit design, disadvantages do exist. One such disadvantage is that conventional HLL-based circuit design typically requires a significant amount of processing resources to understand the HLL program at compile time. One reason for this is that conditional instructions, such as "if" instructions, must be analyzed and resolved. If one branch of the conditional instruction is longer than the other, additional stages of circuitry must be inserted into the shorter branch so that the two branches essentially require the same amount of time to execute.

Another disadvantage is that the structure of the original HLL program is lost when the hardware representation is generated. A direct conversion of the HLL program to gates is performed without any intermediate output. In consequence, any debugging that may be necessary must be performed at the RTL level, rather than on the HLL program.

Debugging at the RTL level, however, does not provide developers with an intuitive means for correcting errors or bugs.

It would be beneficial to provide a technique for designing a circuit using an HLL that is more intuitive than existing technologies and which overcomes the deficiencies described above.

SUMMARY OF THE INVENTION

The present invention provides methods relating to the creation of a circuit design from a high level programming language (HLL) program. One embodiment of the present invention can include a method of creating a circuit from an HLL program. The method can include generating a netlist specifying the circuit from the HLL program. The method also can include running the circuit within a programmable logic device (PLD) and identifying a plurality of execution threads for the circuit at runtime to determine scheduling information.

The circuit can execute the execution threads in parallel or in a pipelined fashion. The running step can include associating each of the plurality of execution threads with a sequence number and scheduling the circuit according to the sequence numbers.

The method further can include translating the HLL program into an assembly language program written in an assembly language. The assembly language program can include instructions and/or pseudo-instructions. The generating step can include creating hardware components for instructions of the assembly language program. In one embodiment, one hardware component can be created for each instruction. First-in-first-outs (FIFOs) corresponding to operands of the instructions of the assembly language program can be created. The FIFOs can link the hardware components.

The translating step can include identifying constructs of the HLL program and mapping the constructs to instructions and/or pseudo-instructions of the assembly language. In one embodiment, the method can include instantiating at least one hardware component in the PLD based upon a conditional branching construct of the assembly language program. In another embodiment, at least one hardware component in the PLD can be instantiated based upon a looping construct of the assembly language program. In either embodiment, signal flow through the at least one hardware component can be determined according to selected ones of the plurality of execution threads.

Another embodiment of the present invention can include a method of creating a circuit design from an HLL program including translating the HLL program into an intermediate format and generating a netlist from the intermediate format. The netlist can specify the circuit design. The circuit design can be executed within a PLD where a plurality of execution threads for the circuit design can be identified at runtime to determine scheduling information.

The intermediate format can be human readable and editable format. In one embodiment, the intermediate format can be an assembly language program written in an assembly language. The assembly language can include, at least in part, instructions and pseudo instructions. The method also can include creating hardware components for instructions of the assembly language program and creating FIFOs for operands of the instructions of the assembly language program. The FIFOs can link the hardware components.

The translating step can include identifying constructs of the HLL program and mapping the constructs to instructions and pseudo-instructions of the assembly language. The executing step can include assigning a sequence number to each of the plurality of execution threads and scheduling the circuit design according to the sequence numbers.

Accordingly, in one embodiment, the translating step can include identifying a conditional branching construct of the HLL program and mapping the conditional branching construct to at least one conditional branching instruction of the assembly language. Signal flow through the conditional branching instruction(s) can be determined according to the sequence numbers. In another embodiment, the translating step can include identifying a looping construct of the HLL program and mapping the looping construct to at least one looping instruction of the assembly language. Signal flow through the looping instruction(s) can be determined according to the sequence numbers.

Yet another embodiment of the present invention can include a method of creating a circuit design from an HLL program. The method can include translating the HLL program into an assembly language program written in an assembly language and generating a netlist from the assembly language program. The netlist can specify the circuit design. The method further can include running the circuit design within a programmable logic device. The running step can include identifying a plurality of execution threads for the circuit design at runtime, associating each of the plurality of execution threads with a sequence number, and scheduling the circuit design according to the sequence numbers.

BRIEF DESCRIPTION OF THE DRAWINGS

There are shown in the drawings, embodiments which are presently preferred, it being understood, however, that the invention is not limited to the precise arrangements and instrumentalities shown.

FIG. 8 illustrates another example of an HLL "for" construct.

FIG. 9 illustrates an assembly language translation of the HLL "for" construct shown in FIG. 8 in accordance with the inventive arrangements disclosed herein.

FIG. 11 illustrates an example of an HLL finite impulse response (FIR) filter implementation.

FIG. 12 illustrates an assembly language translation of the HLL FIR implementation of FIG. 11 in accordance with the inventive arrangements disclosed herein.

DETAILED DESCRIPTION OF THE INVENTION

The present invention provides a solution for generating a hardware or circuit design from a high level programming language (HLL) program. In accordance with the inventive arrangements disclosed herein, an HLL program that is representative of a circuit design can be translated into a netlist or other software-based circuit representation. The circuit design can be implemented in a programmable logic device (PLD) such as a field programmable gate array (FPGA), or the like.

The HLL program can be translated into an intermediate format written in a type of assembly language. The intermediate format is such that instructions generally correspond to logic blocks and operands of the instructions generally correspond to first-in-first-outs (FIFOs). The intermediate representation of the circuit design corresponds to the resulting hardware representation in a more direct fashion than conventional HLL-to-gate generation technologies. Accordingly, the present invention provides designers with a more intuitive way in which to debug the resulting circuit design, i.e. by debugging the intermediate format.

Rather than attempt to develop a circuit design which relies upon a high degree of parallelization, an embodiment of the present invention seeks to create circuit designs by taking advantage of pipelining. By relying upon pipelining, this embodiment of the present invention allows developers to think in terms of sequential steps rather than parallel processes, thereby achieving a more intuitive design methodology. Further, use of pipelining increases computational efficiency as a loop of "N" iterations would require N times the number of cycles (C) to complete on a conventional Von Neuman architecture-type machine. Using a pipelined machine, however, such a loop would require N+C cycles to complete.

Figure 1:
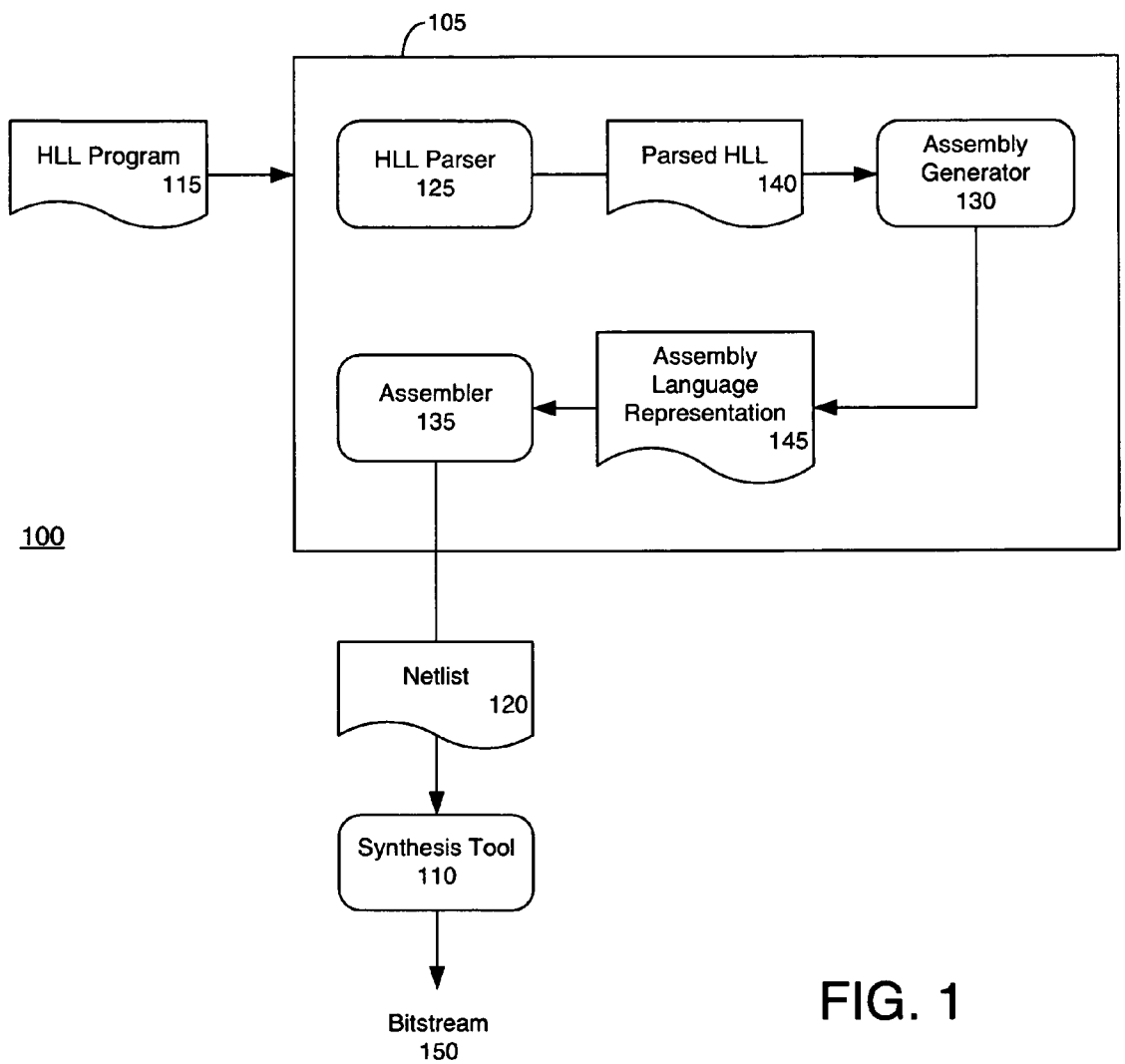
FIG. 1 is a schematic diagram illustrating a system for generating a circuit design from a high level programming language (HLL) program in accordance with the inventive arrangements disclosed herein.

FIG. 1 is a schematic diagram illustrating a system 100 for generating a hardware description of a circuit design from an HLL program in accordance with the inventive arrangements disclosed herein. As shown, the system can include a compiler 105 and a synthesis tool 110. System 100 can be implemented as a collection of one or more computer programs executing within a suitable information processing system.

In general, the compiler 105 can translate an HLL program 115 to a netlist 120 or other hardware description of a circuit design. The compiler 105 receives HLL program 115 as input and provides netlist 120 as output. The functionality of the circuit to be developed is embodied by the HLL program 115. That is, the HLL program 115 is an HLL representation of the circuit. As known, the HLL program 115 can be implemented using any of a variety of different HLLs, whether Fortran, C/C++, JAVA, or the like. It should be appreciated that the particular HLL used is not intended to limit the scope of the present invention. Rather, any of a variety of different HLLs can be used.

According to one embodiment of the present invention, compiler 105 can include several different components that facilitate the translation of HLL program 115 to the netlist 120. Compiler 105 can include an HLL parser 125, an assembly generator 130, and an assembler 135. The HLL parser 125 can be implemented as any of a variety of commercially available parsers or as a parser offered under, or from, the GNU Project so long as the parser is configured to process the particular HLL used to code HLL program 115. The HLL parser 125 receives the HLL program 115, which includes sequential source program instructions, and resolves each instruction into its component parts to produce parsed HLL 140. The HLL parser 125 further can determine whether the received HLL program 115 conforms to a defined standard or syntax.

The assembly generator 130 receives the parsed HLL file 140 as input and translates it into an assembly language representation or program 145. The particular assembly language into which the parsed HLL 140 is translated can be referred to as "CHiMPS". CHiMPS is an acronym that stands for "compiling HLL into massively pipelined systems". Assembly language representation 145, being converted into the CHiMPS assembly language, is an intermediate format that, similar to the HLL program 115, also specifies the circuit design to be developed. This intermediate format can be read by a human being and further can be edited.

The assembly language representation 145 then can be provided to the assembler 135. The assembler 135 processes the assembly language representation 145 and translates it into the netlist 120. The assembler 135 can be implemented as a single pass assembler. Still, a preprocessor can be included which can resolve any include files and define instructions. The netlist 120 can be a structural HDL netlist that specifies FIFO's and logic blocks. The resulting netlist 120 can be provided directly to the synthesis tool 110. The synthesis tool 110 can generate a bit stream 150 which can be downloaded into a PLD to program the device.

Once the PLD is programmed with the circuit design, the circuit design can be executed or run within the PLD. At that time, execution threads can be identified rather than at the time the HLL program is compiled. Each time an execution thread is generated, i.e. a new branch of a conditional branch is started or a new repetition of a loop is started, that execution thread can be identified. Each execution thread can be associated with an identifier, referred to as a sequence number. The sequence numbers can be used within the circuit design to emulate flow control of the HLL program 115.

Generally, each sequence number corresponds to a particular execution thread and conveys scheduling information for the circuit design, thereby facilitating a pipelined architecture and achieving a degree of parallelism within the circuit design. The circuit can execute the execution threads in parallel or in a pipelined fashion. This alleviates the need to add additional stages to branches from conditional statements so that each branch requires the same amount of time to complete.

The CHiMPS assembly language, like conventional assembly languages, utilizes op-code mnemonics and operands. Within the CHiMPS assembly language, instructions and pseudo-instructions are used. Generally, instructions cause some type of hardware to be generated, while pseudo-instructions provide information to the assembler. Instructions correspond to predefined hardware modules and operands of instructions correspond to FIFOs or registers. In other words, the instructions of the assembly language representation typically are converted into instantiations of predefined hardware modules. The predefined hardware modules act on the operands, which are converted into FIFOs linking the hardware modules.

Pseudo-instructions provide information to the assembler to provide context to the set of instructions following the pseudo-instruction. Examples of pseudo-instructions can include, but are not limited to, reg, unreg, call, enter, and exit. Some pseudo-instructions may indirectly cause hardware to be generated, such as the reg pseudo-instruction to be described herein. The reg pseudo-instruction appears to lead to the creation of one or more FIFOs when those registers are used. The creation of the FIFOs is incidental to the instruction that creates the hardware, however, and not to the pseudo-instruction that declared the hardware.

The syntax of the reg pseudo-instruction is: reg <list of registers>. The reg pseudo-instruction tells the assembler that the named registers in the list of registers will be used in upcoming instructions. The list of registers will be created with a default list of 32 bits unless otherwise specified. The reg pseudo-instruction instructs the assembler to create FIFOs to carry the values of each register through the instructions that follow until the registers are "unreged".

The unreg pseudo-instruction specifies a listing of registers that will no longer be used. The syntax of the unreg pseudo-instruction is: unreg <list of registers>. As with the reg pseudo-instruction, the operands of the pseudo-instruction are the registers within the list of registers. Any FIFOs associated with the listed registers can be trimmed back to the point of their last use. The name space will be purged of the named register(s), thereby freeing the registers for use again if needed.

The call pseudo-instruction will cause the assembler to search for a function with a matching name. The syntax for this pseudo-instruction is: call <function name> [;[<input registers>] [;<output registers>]]. The assembler will replace the call pseudo-instruction with the entire contents of the function. Thus, rather than including a reference to the called function, a full copy of the function can be made. The input registers specify the inputs to the function and the output registers will contain the outputs of the function. Default widths for the registers can be assumed unless otherwise stated within the call pseudo-instruction.

The enter pseudo-instruction defines a function that can be called. The syntax for the enter pseudo-instruction is: enter <function name>[;<input registers>]. The input registers specified serve as placeholders for registers that will be passed into the specified function from the calling function. The exit pseudo-instruction signals the end of the function defined by the enter pseudo-instruction. Code between the enter and exit pseudo-instructions will be copied wherever the call is made. The output registers specified will define which FIFOs are to be mapped to the output registers specified on the call statement.

Instructions, as noted, typically cause hardware to be instantiated. Generally, one instruction causes one instantiation of a hardware component. Instructions are composed largely of operational instructions and flow-control instructions. Operational instructions wait for all arguments to appear on the input FIFOs. When those arguments are available, the operational instruction performs the specified function and one or more output FIFOs are provided with the result. By comparison, flow-control instructions generally split or merge the pipeline based on information either from prior instructions or by using the sequence numbers corresponding to the execution threads of the HLL program.

Operational instructions can include, but are not limited to, integer arithmetic instructions, logical operation instructions, and floating-point arithmetic instructions. In illustration, integer arithmetic functions can include, addition, subtraction, multiplication, and division, which typically take one cycle to operate. Still, more complex instructions, such as divide, can require additional cycles. Logical operation instructions can include shift operations such as logical shift right or left and arithmetic shift right or left. These operations can be handled within registers and typically require no cycles to complete.

Flow control instructions can include conditional branching and looping instructions. Examples of conditional branching instructions can include the demux, branch, unbranch, and mux instructions. The syntax of the demux instruction is: demux <muxid>[:n];<condition>; <branch0id>;<branch1id>;<list of registers>. The demux instruction examines the <condition>. Depending upon the value of <condition>, the instruction de-multiplexes the specified registers along with the sequence number corresponding to the code associated with either branch instruction specified by branch0id> or <branch1id>.

If the value of the <condition> operand is zero, then the code labeled <branch0> receives the registers, otherwise <branch1> receives the registers. The <muxid> operand is a unique identifier used to match a particular demux instruction up with both the branches and the corresponding mux instruction. The number "n" indicates the depth of the FIFO that needs to be allocated for registers, including the sequence number, that are not passed into the conditional. Generally, the number should be equal to number of instructions in the longer of the two branches. If not specified, a default depth can be used.

The branch instruction initiates code belonging to a specific branch as specified by the <branchid> operand of the demux instruction. The syntax of the instruction is: branch <branchid>;<list of registers>. Branch is actually a pseudo-instruction as no hardware is generated. A new register namespace is created containing only those registers in the <list of registers>, which must exactly match the list specified by the demux instruction.

The unbranch instruction, like the branch instruction, is a pseudo-instruction. The unbranch instruction indicates the end of a particular branch. The register namespace is restored to its value prior to the most recent branch instruction with a matching <branchid>. The syntax for the unbranch pseudo-instruction is: unbranch <branchid>;<list of registers>.

The mux instruction multiplexes the list of registers back together depending upon the sequence number passed by the demux instruction having a matching <muxid>. The syntax for the mux instruction is: mux <branchid>;<list of registers>.

Figures 2, 3, 4:
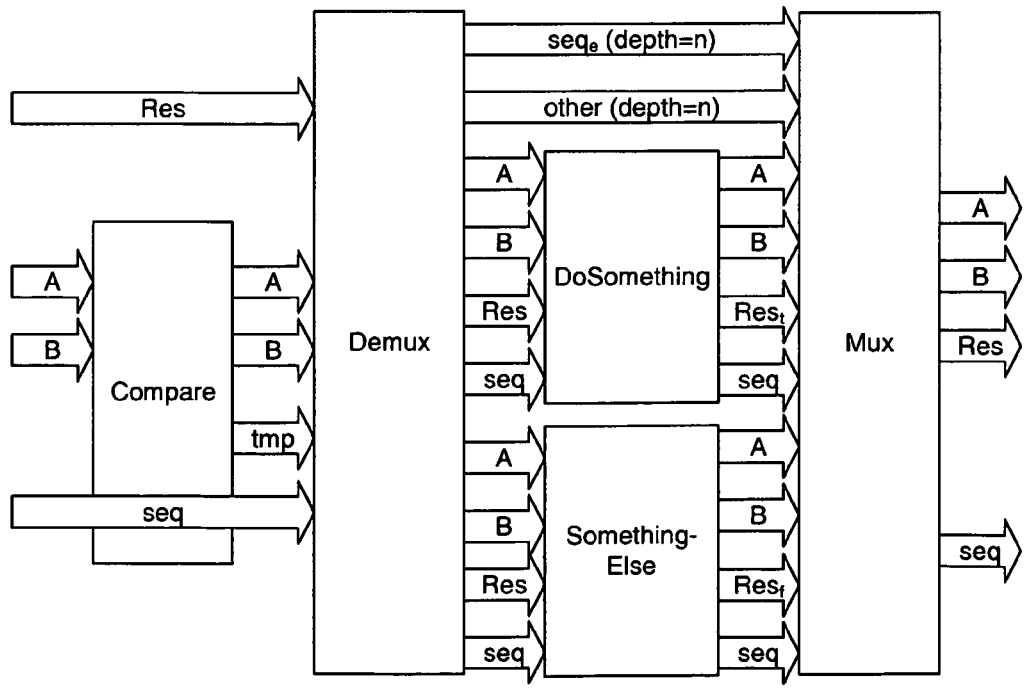
FIG. 2 illustrates an example of an HLL "if" construct.
FIG. 3 illustrates an assembly language translation of the HLL "if" construct shown in FIG. 2 in accordance with the inventive arrangements disclosed herein.
FIG. 4 is a schematic diagram illustrating a circuit design generated from the assembly language translation of FIG. 3 in accordance with the inventive arrangements disclosed herein.

FIG. 2 illustrates an example of an HLL "if" construct. A construct refers to a data structure used for a particular purpose. A construct can refer to a single programming language statement or a collection more than one statement such as a loop, method, function, or the like, where the collection has a particular function or purpose. Constructs also are defined by organizations such as the Institute of Electrical and Electronics Engineers (IEEE) and the American National Standards Institute (ANSI). These organizations set forth standards for programming languages such as C, C++, Verilog, and VHDL, with each standard defining the available constructs for a given language.

In any case, the "if" construct illustrated in FIG. 2 can be incorporated into a larger HLL programmatic representation of a hardware design. When provided to a compiler as described herein, the constructs of the HLL program can be identified and an assembly language representation in the CHiMPS assembly language can be generated. FIG. 3 illustrates the CHiMPS assembly language translation or representation of the HLL "if" construct. The CHiMPS code shown in FIG. 3 illustrates the conditional branching instructions demux, branch, unbranch, and mux described above.

From the assembly language representation shown in FIG. 3, the compiler generates a netlist. The netlist specifies the pipelined hardware configuration depicted in FIG. 4. As shown, the instructions of the assembly language representation have been transformed into hardware instantiations and the operands have become FIFOs linking the hardware instantiations. In this case, the add instruction corresponds with the compare hardware module.

Generally, a loop in the CHiMPS assembly language includes four stages. The stages include initialization, test for exit condition, body, and iterator. The initialization can be performed prior to the start of the loop. The three other stages can execute iteratively and should occur in parallel. The following list specifies the general structure of a loop with the stages being shown in bold: initialization code, begin instruction, test for exit, loop instruction, loop body, iterator instruction, iterator code, iterate instruction, end instruction.

It should be appreciated that while the iterator code is shown after the loop body, it executes in parallel with the loop body. Accordingly, any modification of the loop variables which occurs in the iterator stage will not be visible to the loop body stage until the next iteration. Further, the loop body cannot affect the iterator variables. Any instructions that do so need to be moved or replicated within the iterator code.

Looping instructions within the CHiMPS assembly language can include the begin, loop, end, iterator, and iterate instructions alluded to above. The syntax for the begin instruction is: begin <loopid>;<loop registers>;<iterator registers>. The begin instruction creates a new register called the end FIFO which is pushed to the corresponding end instruction. If the <iterator registers> receive values, these values replace the copies stored in the internal memory and a new set of outputs is sent downstream. If the end FIFO becomes empty, the loop restarts. The begin instruction further generates a local sequence number that is passed to the instructions inside the loop and then incremented each time values are passed downstream.

The loop instruction de-multiplexes the loop registers either to the body or to the end instruction. If the condition is nonzero, the loop registers are de-multiplexed to the body. Additionally, the iterator registers are copied to the iterator instruction. If the condition is zero, the loop registers are de-multiplexed to the end instruction. The syntax for the loop instruction is: loop <loopid>;<condition>;<loop registers>;<iterator registers>.

The iterator instruction identifies the start of the iterator code for the identified loop as well as the registers that will be passed into the iterator code from the loop instruction. The syntax for the iterator instruction is: iterator <loopid>; <iterator registers>. The iterate instruction identifies the end of the iterator code for the loop so identified along with the registers that will be passed back to the begin statement for the next iteration. The syntax for the iterate instruction is: iterate <loopid>;<iterator registers>.

The end instruction identifies the end of the loop code along with the result registers that will be passed on at the end of the loop. The syntax of the end instruction is: end <loopid>;<result-regs>. The end instruction receives registers from the loop body and end of the loop from the loop instruction. With the registers from the loop instruction, the end instruction pulls the sequence number from the end FIFO. During execution of the loop, the end instruction continually discards the result registers from the loop, saving the last set. Once the loop ends, the end instruction waits until the result FIFO have a sequence number which is exactly equal to the sequence number being passed from the end instruction minus one. This set of resulting values is passed on with the others being discarded.

Figures 5, 6, 7:
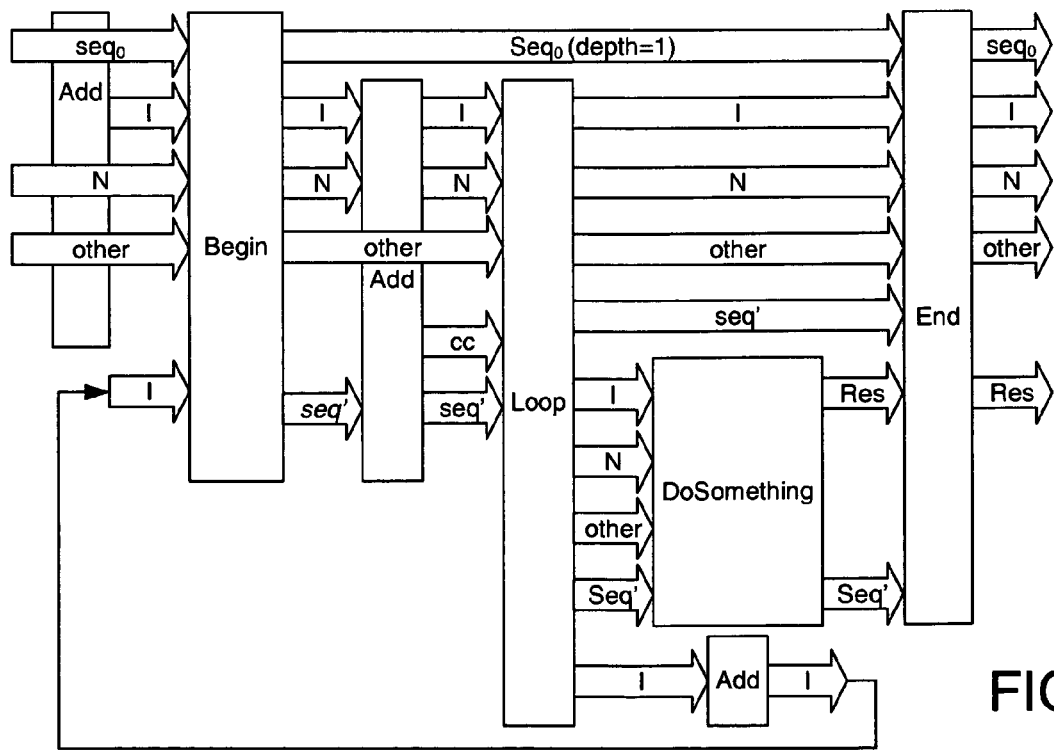
FIG. 5 illustrates an example of an HLL "for" construct.
FIG. 6 illustrates an assembly language translation of the HLL "for" construct shown in FIG. 5 in accordance with the inventive arrangements disclosed herein.
FIG. 7 is a schematic diagram illustrating a circuit design generated from the assembly language translation of FIG. 6 in accordance with the inventive arrangements disclosed herein.

FIG. 5 illustrates an example of an HLL "for" construct. The HLL language construct can be included in a larger HLL program. The compiler can generate a CHiMPS assembly language representation or translation of the "for" construct which is illustrated in FIG. 6. The example shown in FIG. 6 illustrates the looping capability and architecture of the CHiMPS assembly language as described with reference to the begin, loop, iterator, iterate, and end instructions.

The circuitry resulting from the processing of the assembly language of FIG. 6 is illustrated in FIG. 7. As noted, each instruction has been instantiated as a hardware module. The operands of the assembly language instructions have become FIFOs linking the various hardware instantiations. Further, the sequence numbers which correspond to the execution threads of the HLL program, now are used for controlling signal flow through the resulting hardware configuration. As noted, this alleviates the need for including additional stages in the hardware design to ensure that each leg of a conditional branch matches the other in terms of timing.

FIG. 8 illustrates another example of an HLL "for" construct. The assembly language representation of the HLL "for" construct is illustrated in FIG. 9. In this case, the assembly language representation includes two additional instructions. The wait and sync instructions are included and implement aspects of the looping capability of the CHiMPS assembly language. At times, a value is altered inside of a loop and the resulting value is to be used in the next iteration of the loop. The wait and sync instructions implement this functionality.

As noted, the wait instruction is used for synchronizing modified data and data used inside a loop. The syntax of the wait instruction is: wait <waitid>;<wait registers>. The wait instruction receives two sets of registers. One set of registers, denoted as "A", flows from the prior instruction. The other set of registers, denoted as "B", flows from the sync instruction that corresponds with the wait instruction. The wait instruction stores an expected sequence number denoted as "E", that starts at −1 and is used to select which registers are to be passed through.

The sequence number E is evaluated against the sequence number corresponding to register set A. The registers can be passed through in one of two different ways. If the sequence number in set A is greater than that stored in E, then the A set of registers is passed on. In that case the expected sequence number E is set to the one in set A plus 1. If the sequence number in set A is equal to that stored in E, the B set of registers is pulled off and discarded until a set with a sequence number equal to the sequence number stored in E minus 1 is found. When found, those registers are passed on and the sequence number stored in E is incremented.

Figure 10:
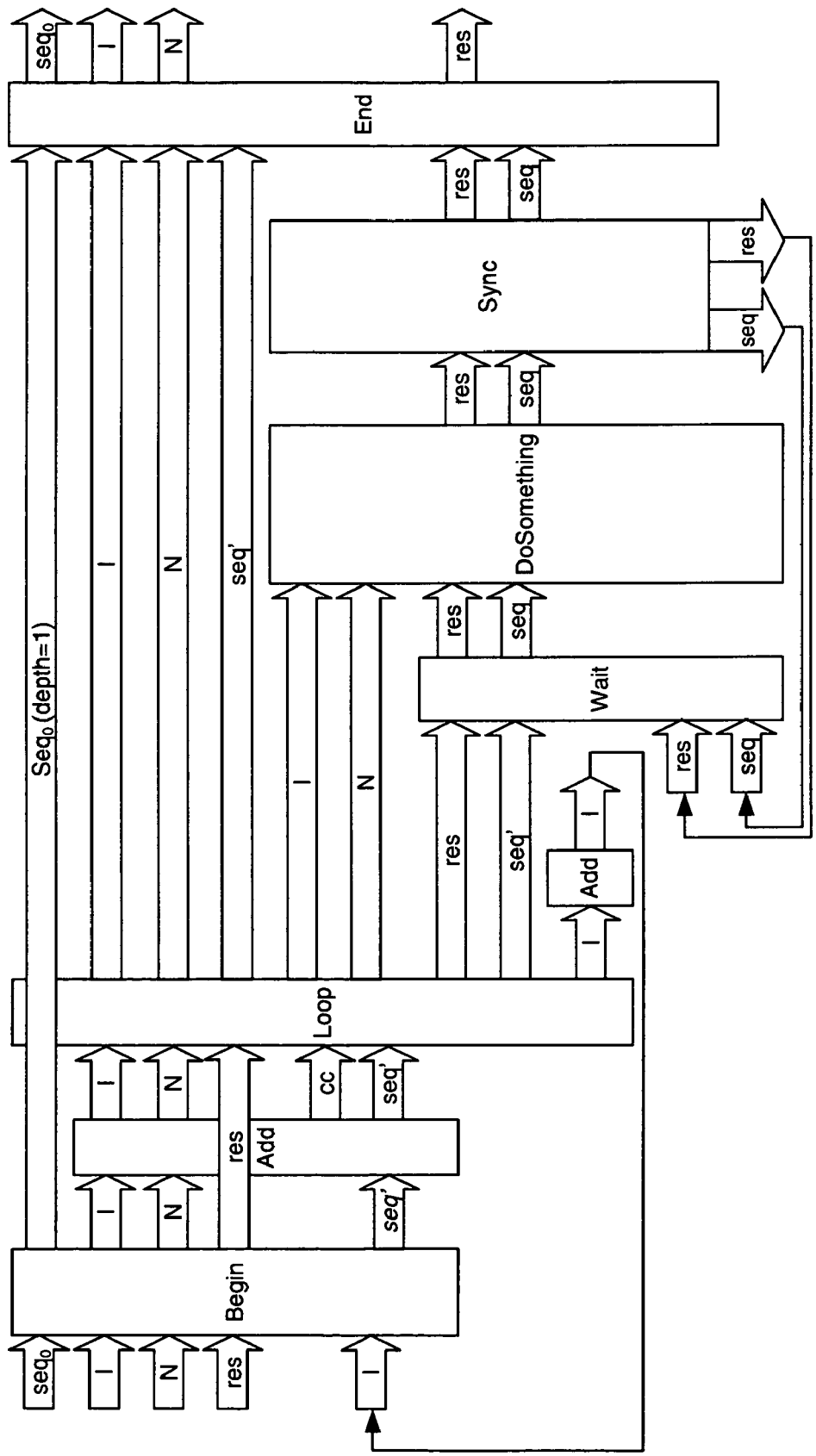
FIG. 10 is a schematic diagram illustrating a circuit design generated from the assembly language translation of FIG. 9 in accordance with the inventive arrangements disclosed herein.

The sync instruction is matched with a wait instruction, and as such, the arguments must be identical. The syntax for the sync instruction is: sync <loopid>, <list of registers>. The sync instruction duplicates registers in the register list and sends one set of registers on and the other set of registers back to the B side of the wait instruction. The wait and sync instructions must be located before and after the first and last references of variables modified during a loop. The circuitry resulting from the assembly language shown in FIG. 9 is depicted in FIG. 10.

FIG. 11 illustrates an example of an HLL finite impulse response (FIR) filter implementation. The assembly language representation of the HLL FIR filter is illustrated in FIG. 12.

Figure 13:
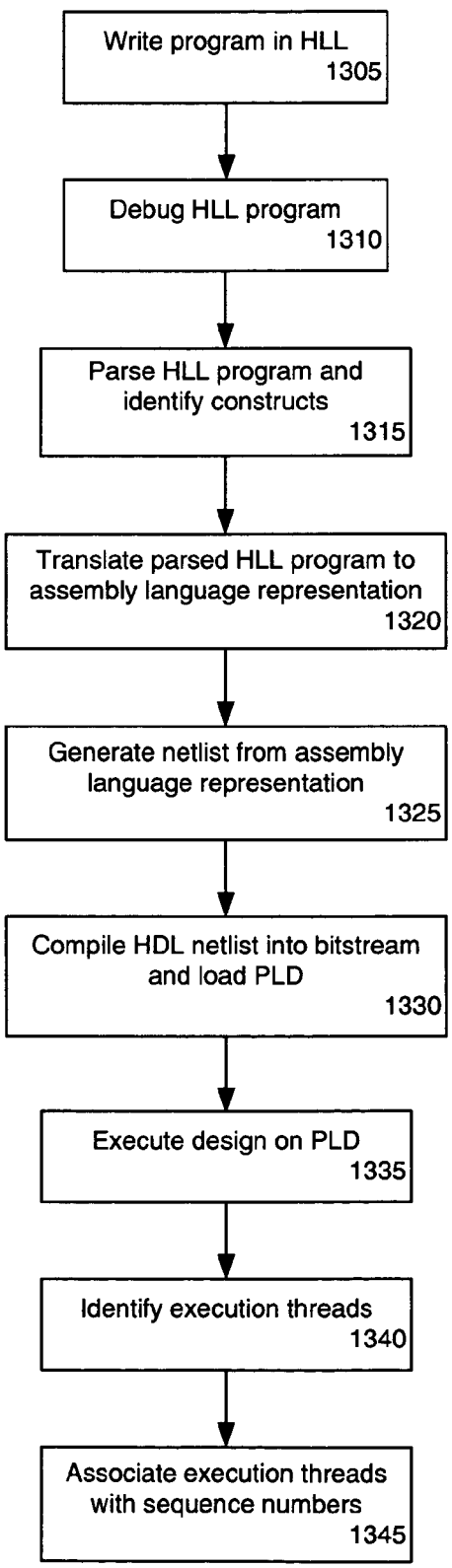
FIG. 13 is a flow chart illustrating a method of generating a circuit design from an HLL program in accordance with the inventive arrangements disclosed herein.

FIG. 13 is a flow chart illustrating a method 1300 of generating a circuit design or hardware configuration from an HLL program in accordance with the inventive arrangements disclosed herein. The method can begin in step 1305 where a program can be written in an HLL. The HLL program, generally, is an algorithmic representation of a circuit design, for example for a PLD such as an FPGA, that is to be generated from the HLL program. In step 1310, the HLL program can be debugged and/or tested.

In step 1315, the HLL program can be provided to a compiler where the HLL program can be parsed and the various constructs of the HLL program can be identified. The parsed HLL program can be translated into an assembly language representation or program in step 1320. The assembly language used can be the CHiMPS assembly language or another language having substantially similar functionality as described herein. The various constructs of the HLL program can be identified and mapped to associated assembly language instructions.

In step 1325, the assembly language program can be translated into a netlist specifying a hardware design. The netlist generated from the assembly language representation specifies the logic structures and signals of the design. In step 1330, the netlist can be compiled into a bitstream and loaded into a PLD. Accordingly, hardware components within the PLD can be instantiated based upon constructs and/or instructions of the assembly language program. In step 1335, the design can be executed and/or run within the PLD. At runtime, any execution threads can be identified in step 1340.

In step 1345, each execution thread can be associated with an identifier or sequence number. The sequence numbers can be used by the instantiated hardware components of the PLD to control signal flow through the PLD hardware. That is, sequence numbers utilized by various constructs, as described herein, can be used to control operations such as multiplexing, de-multiplexing, and looping within the circuit design. Thus, signal flow through the hardware components can be determined according to the execution threads. The circuit effectively executes the execution threads in a parallel or pipelined fashion. In any case, the resulting PLD hardware components generally form a pipelined system architecture where the instructions of the assembly language representation generally correspond to hardware modules and the operands correspond to registers linking the hardware modules.

The present invention provides a solution for creating a hardware and/or circuit design from an HLL program. In accordance with the inventive arrangements disclosed herein, an HLL program can be parsed and translated into an intermediate format. The intermediate format is a variety of assembly language. The assembly language representation of the design provides designers with a more intuitive format which can be edited as many instructions of the translated design correspond with hardware on a one-to-one basis. In any case, the assembly language representation can be converted to a netlist specifying the hardware and/or circuit design.

When a PLD is programmed with the circuit design, the design can be run. At runtime, execution threads can be identified. The execution threads can be used by the circuit design during operation to control signal flow through hardware components corresponding to looping constructs, conditional branching constructs, or any other constructs responsible for generating execution threads. Accordingly, scheduling of the circuit design can be performed based upon the execution threads identified at runtime of the circuit rather that at the time of compilation of the HLL program.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program, program, application, and/or software, in the present context, means any expression, in any language, code or notation, of a set of instructions intended to cause a system having an information processing capability to perform a particular function either directly or after either or both of the following: a) conversion to another language, code, or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A method of creating a circuit from a high level programming language (HLL) program, said method comprising:
    translating the HLL program into an assembly language program written in an assembly language, wherein the assembly language program comprises instructions corresponding to hardware components and pseudo instructions;
    generating a netlist from the assembly language program, wherein the netlist specifies the circuit;
    running the circuit within a programmable logic device and identifying a plurality of execution threads for the circuit at runtime to determine scheduling information; and
    instantiating at least one hardware component in the programmable logic device based upon a conditional branching construct of the assembly language program, such that signal flow through the at least one hardware component is determined according to selected ones of the plurality of execution threads.

2. The method of claim 1, wherein the circuit executes the execution threads in parallel.

3. The method of claim 1, wherein the circuit executes the execution threads in a pipelined fashion.

4. The method of claim 1, said running step further comprising:
    associating each of the plurality of execution threads with a sequence number; and
    scheduling the circuit according to the sequence numbers.

5. The method of claim 1, said generating step further comprising creating hardware components for instructions of the assembly language program.

6. The method of claim 5, said generating step further comprising creating one hardware component for each instruction of the assembly language program.

7. The method of claim 5, said generating step further comprising creating first-in-first-outs for operands of the instructions of the assembly language program, wherein the first-in-first-outs link the hardware components.

8. The method of claim 1, said translating step further comprising:
    identifying constructs of the HLL program; and
    mapping the constructs to instructions and pseudo-instructions of the assembly language.

9. The method of claim 1, further comprising:
    instantiating at least one hardware component in the programmable logic device based upon a looping construct of the assembly language program, such that signal flow through the at least one hardware component is determined according to selected ones of the plurality of execution threads.

10. A method of creating a circuit from a high level programming language (HLL) program, said method comprising:
    translating the HLL program into an assembly language program written in an assembly language, wherein the assembly language program comprises instructions corresponding to hardware components and pseudo instructions;
    generating a netlist from the intermediate format, wherein the netlist specifies the circuit;
    running the circuit within a programmable logic device and identifying a plurality of execution threads for the circuit at runtime to determine scheduling information; and
    instantiating at least one hardware component in the programmable logic device based upon a looping construct of the assembly language program, such that signal flow through the at least one hardware component is determined according to selected ones of the plurality of execution threads.

11. The method of claim 10, wherein running further comprises:
    associating each of the plurality of execution threads with a sequence number; and
    scheduling the circuit according to the sequence numbers.

12. The method of claim 10, further comprising:
    creating hardware components for instructions of the assembly language program; and
    creating first-in-first-outs for operands of the instructions of the assembly language program, wherein the first-in-first-outs link the hardware components.

13. The method of claim 10, said translating step further comprising:
    identifying constructs of the HLL program; and
    mapping the constructs to instructions and pseudo-instructions of the assembly language.

14. The method of claim 10, further comprising instantiating at least one hardware component in the programmable logic device based upon a conditional branching construct of the assembly language program, such that signal flow through the at least one hardware component is determined according to selected ones of the plurality of execution threads.

15. A method of creating a circuit design from a high level programming language (HLL) program, said method comprising:

translating the HLL program into an assembly language program written in an assembly language, wherein instructions of the assembly language program correspond to hardware components;

generating a netlist from the assembly language program, wherein the netlist specifies the circuit design;

running the circuit design within a programmable logic device, said running step comprising:
identifying a plurality of execution threads for the circuit design at runtime;
associating each of the plurality of execution threads with a sequence number; and
scheduling the circuit design according to the sequence numbers; and instantiating at least one hardware component in the programmable logic device based upon at least one of a looping construct or a conditional branching construct of the assembly language program, such that signal flow through the at least one hardware component is determined according to selected ones of the plurality of execution threads.

* * * * *